United States Patent
Kruger et al.

(10) Patent No.: US 7,437,188 B2
(45) Date of Patent: Oct. 14, 2008

(54) METHOD FOR REDUCING ARTIFACTS IN MAGNETIC RESONANCE IMAGES ACQUIRED WITH CONTINUOUS TABLE MOTION

(75) Inventors: Daivd G. Kruger, Nelson, WI (US); Stephen J. Riederer, Rochester, MN (US); Phillip J. Rossman, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 632 days.

(21) Appl. No.: 11/060,934

(22) Filed: Feb. 18, 2005

(65) Prior Publication Data
US 2006/0241390 A1 Oct. 26, 2006

(51) Int. Cl.
*A61B 5/05* (2006.01)
(52) U.S. Cl. .................................................. 600/410
(58) Field of Classification Search ................ 600/407, 600/410, 476, 414, 415; 324/307
See application file for complete search history.

(56) References Cited

U.S. PATENT DOCUMENTS

| | | | |
|---|---|---|---|
| 5,912,557 A * | 6/1999 | Wilman et al. | 324/309 |
| 6,184,682 B1 * | 2/2001 | Ehman et al. | 324/309 |
| 6,671,536 B2 * | 12/2003 | Mistretta | 600/410 |
| 2002/0173715 A1 * | 11/2002 | Kruger et al. | 600/410 |

OTHER PUBLICATIONS

David G. Kruger et al., Continuously Moving Table Data Acquisition Method For Long FOV Contrast-Enhanced MRA and Whole-Body MRI, Mag. Reson. in Med,. 47:2240231 (2002).

* cited by examiner

*Primary Examiner*—Eric F Winakur
*Assistant Examiner*—Katherine L Fernandez
(74) *Attorney, Agent, or Firm*—Quarles & Brady LLP

(57) ABSTRACT

MRA data is acquired from a large, longitudinal region of interest by translating the patient through the more limited longitudinal FOV of the MRI system as a three-dimensional MRA data set are acquired. Patient table movement is controlled to track a bolus of contrast agent as it passes through the region of interest. A seamless image of the entire region of interest is reconstructed after correcting the phase of acquired MRA data to reduce the signal falloff at abutting longitudinal FOVs. Phase corrections are determined from the central DC views acquired during the scan.

19 Claims, 9 Drawing Sheets

METHOD FOR REDUCING ARTIFACTS IN MAGNETIC RESONANCE IMAGES ACQUIRED WITH CONTINUOUS TABLE MOTION

STATEMENT REGARDING FEDERALLY SPONSORED RESEARCH

This invention was made with government support under Grant HL70620 and EB00212 awarded by the National Institute of Health. The United States Government has certain rights in this invention.

BACKGROUND OF THE INVENTION

The field of the invention is magnetic resonance imaging ("MRI") of extended fields of view, and particularly MR angiography ("MRA"), studies of the human vasculature using contrast agents which enhance the NMR signals.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals, or "views" are digitized and processed to reconstruct the image using one of many well known reconstruction techniques.

MR angiography (MRA) is the application of magnetic resonance imaging methods to the depiction of the human vasculature. To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM*, p 203, 1997. As described in U.S. Pat. Nos. 5,924,987 and 5,928,148, MRA data is acquired from a large field of view by automatically moving the patient table to a plurality of different locations during the scan and acquiring an image at each station. The movement of the table may be timed to follow the contrast bolus through the vasculature so that peak contrast is achieved at each station.

The result of prior bolus chase MRA methods is that one ends up with a plurality of images. These are manually or automatically registered with each other to provide a single image that covers the entire extended field of view. One difficulty with this approach, however, is that the separate images have different brightnesses and/or contrasts. As a result, there are discontinuities at the boundaries of images where they have been patched together. Another difficulty with the multi-station method is that valuable time is lost when the table is moved from one station to the next. During that time no image data is being acquired and further time is lost in bringing the spin magnetization into dynamic equilibrium before image data is acquired. In a three-dimensional scan this lost data acquisition time can mean that the scanning process does not keep pace with the moving contrast bolus and some image contrast is lost in later images.

As described in co-pending U.S. patent application Ser. No. 09/993,120 filed on Nov. 26, 2001 and entitled "Method For Acquiring MRI Data From A Large Field Of view Using Continuous Table Motion", one can also acquire MRI data from an extended field of view in one continuous scan. With this method the patient table is in continuous motion and the phase encodings along y (and along z if 3D) are repeatedly cycled during the scan. One large image over the extended longitudinal FOV is reconstructed from the acquired MRI data.

Artifacts in the form of periodic signal falloff have been observed in MR images acquired according to this continuous table motion method. Referring to FIG. 7, which is an MR image of an agar gel phantom, the artifacts can be seen as dark regions where the signal has fallen off. In this example, the extended longitudinal FOV of the scan is 65 cm and the artifacts appear at 25 cm intervals in the image of the phantom. The 25 cm intervals between artifacts corresponds to the scanner's longitudinal FOV.

SUMMARY OF THE INVENTION

The present invention is a method for acquiring an artifact-free MR image from an extended longitudinal field of view in which the patient table is continuously moved during the scan.

It is observed that the signal falloff artifact occurs in regions where abutting sub-FOVs join and it is caused by the phase differences between the leading edge of hybrid space data (Fourier transformed along the readout direction which corresponds to the direction of table motion) and the trailing edge of the succeeding acquired hybrid space data. The correction method includes measuring the volume phase shifts that occur along the direction of table motion and correcting the phase of image data acquired from the volume prior to image reconstruction.

A general object of the invention is to correct MRA data acquired with continuous table motion to substantially eliminate signal falloff artifacts that occur at sub-FOV boundaries. This is accomplished by measuring the phase shift that occurs in the data samples along the direction of table motion and correcting the phase of data samples prior to image reconstruction. The phase corrections substantially eliminate phase discontinuities in data samples at sub-FOV boundaries and suppress image artifacts that otherwise result.

A more specific object of the invention is to make the phase corrections in real time as the image data is acquired. The phase shifts for the volume are measured by calculating the phase of the central k-space view ($k_y=0$ and $k_z=0$) after its Fourier transformation along the direction of table motion ($k_x$). The other acquired views of image data from the same image volume are phase corrected by subtracting the measured phase shifts from corresponding samples after Fourier transforming the acquired view. By periodically acquiring the central view of k-space the volume phase shifts can be periodically measured during the scan and used to phase correct subsequently acquired views during the scan.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

A moving table acquisition allows the subject to be imaged over a field of view (FOV) which can be many times larger than the static FOV allowed by a typical MRI scanner. In the preferred embodiment the MRI scanner runs uninterrupted while the patient table is continuously moved through the portion of the scanner volume which presents the best combination of homogeneous static magnetic field and linear magnetic field gradients. This region is typically known as the scanner's "sweet spot." In the preferred embodiment the acquisition of arbitrarily large FOVs along the table motion direction is achieved with one uninterrupted data set. Either two or three-dimensional imaging is possible.

Figure 3:
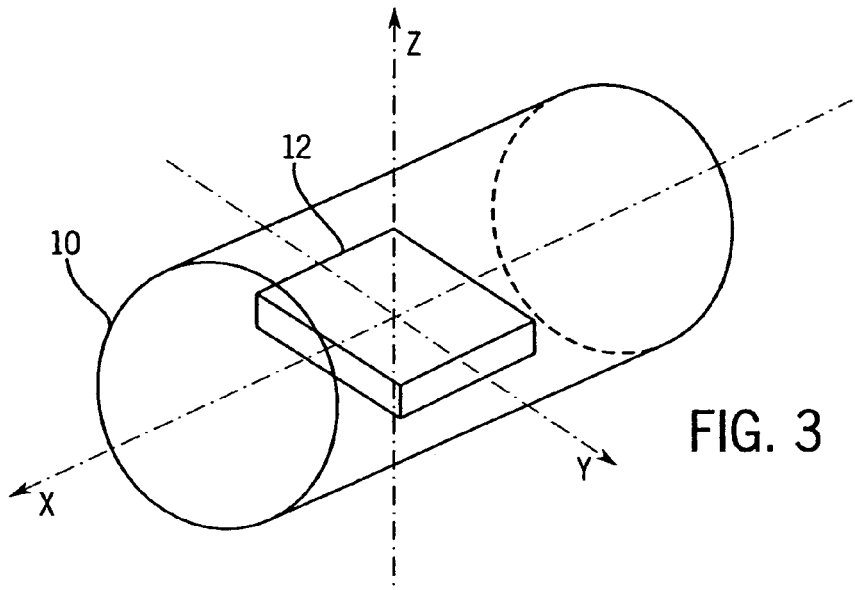
FIG. 3 is a schematic representation of an exemplary imaging volume within the bore of the MRI system of FIG. 1.

Referring to FIG. 3, a slab 12 with coronal orientation is being imaged in the bore 10 of an MRI scanner. The readout direction (X axis) is along the direction of motion of the table and the slab select direction is along the Z axis. For 2DFT imaging, phase encoding is performed along the Y axis and for 3DFT imaging, phase encoding is performed along both the Y and Z axes.

We define $FOV_{tot}$ as the full desired field of view along the "longitudinal" X direction and $FOV_x$ as the field of view along X for the readout of any single NMR signal. We assume that $FOV_{tot} > FOV_x$ thus necessitating the invention described here to provide an image for the full FOV if continuous table motion is desired.

As the subject is moved through the scanner along the x-axis, MRI data is acquired from the slab 12 by a series of imaging pulse sequences. During each pulse sequence the readout of the encoded k-space data is performed in the X direction. The raw k-space data is typically anti-alias filtered and subsequently sampled at a bandwidth assuming some $FOV_x$ in the readout (X) direction.

Figure 4:
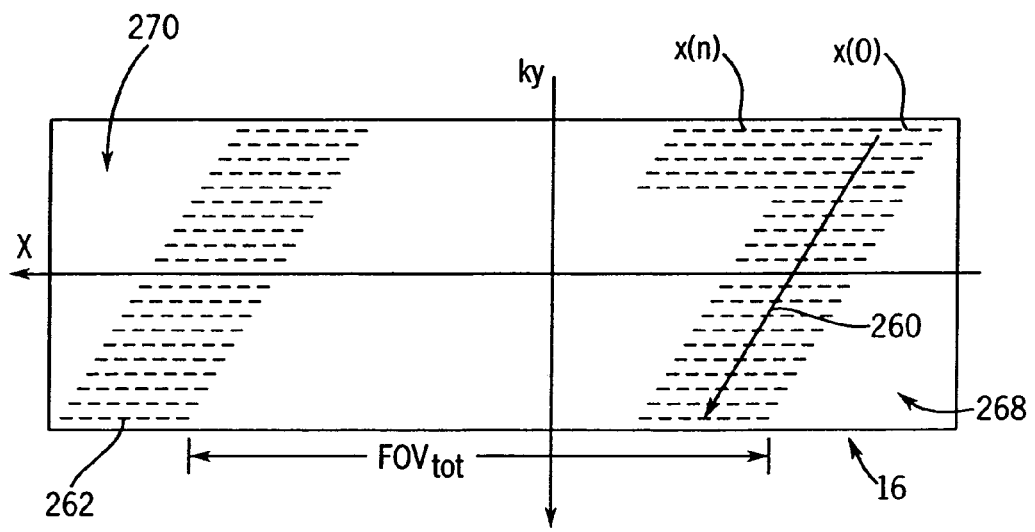
FIG. 4 is a schematic representation of a data matrix into which data acquired with the pulse sequence of FIG. 2 is stored.

Referring to FIG. 4, the raw k-space data are acquired in a series of imaging pulse sequences, a Fourier transformation (FT) is performed on each NMR signal in the readout direction and the result is placed in a matrix of memory locations 16 which represents the desired resolution in the X, Y and Z directions. This once-transformed view is a line of data placed in the matrix 16 and shifted in the X direction to a position that represents the patient position at the time the NMR echo signal was acquired. The position of the patient table relative to a reference location is known for every echo readout. The data acquisition is performed until all of the data matrix 16 is filled and the table has reached the final position. The final image is formed by Fourier transforming along the remaining Y, and if 3D, the Z directions. Such an acquisition and image reconstruction is described in the above-cited co-pending U.S. patent application.

Figure 1:
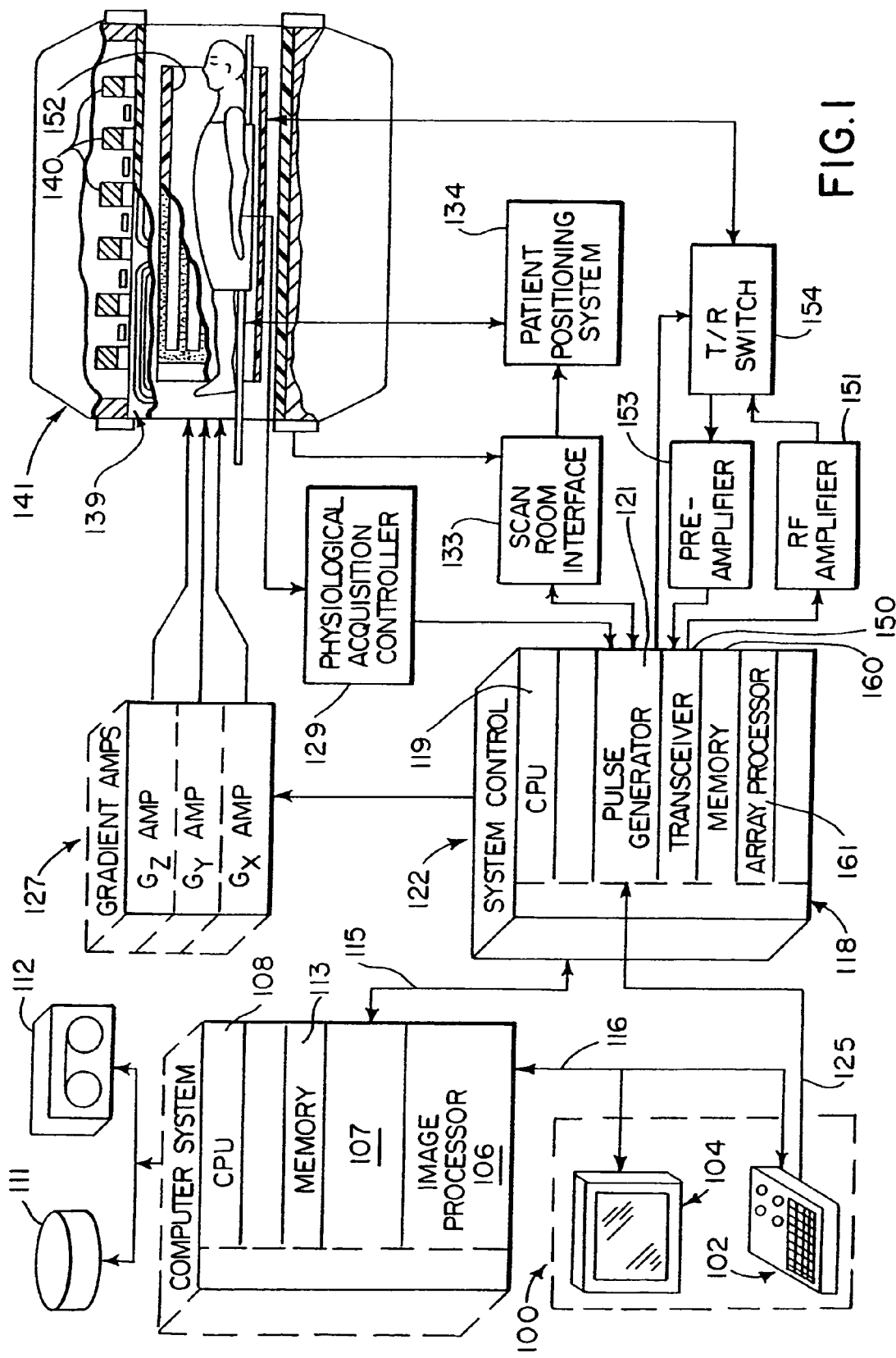
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands from the pulse generator module 121 to move the patient through the scanner to perform the scan in accordance with the present invention. The current position of the table at any time during the scan is read into the system control 122 and is used to adjust the acquired NMR data according to the present invention as will be described in more detail below. The operator can control the operation of the patient positioning system 134 through the keyboard and control panel 102. This includes controlling the velocity of table motion during the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The NMR signals picked up by the RF local coil are digitized by the transceiver module 150 and transferred to a memory module 160 in the system control 122. An array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
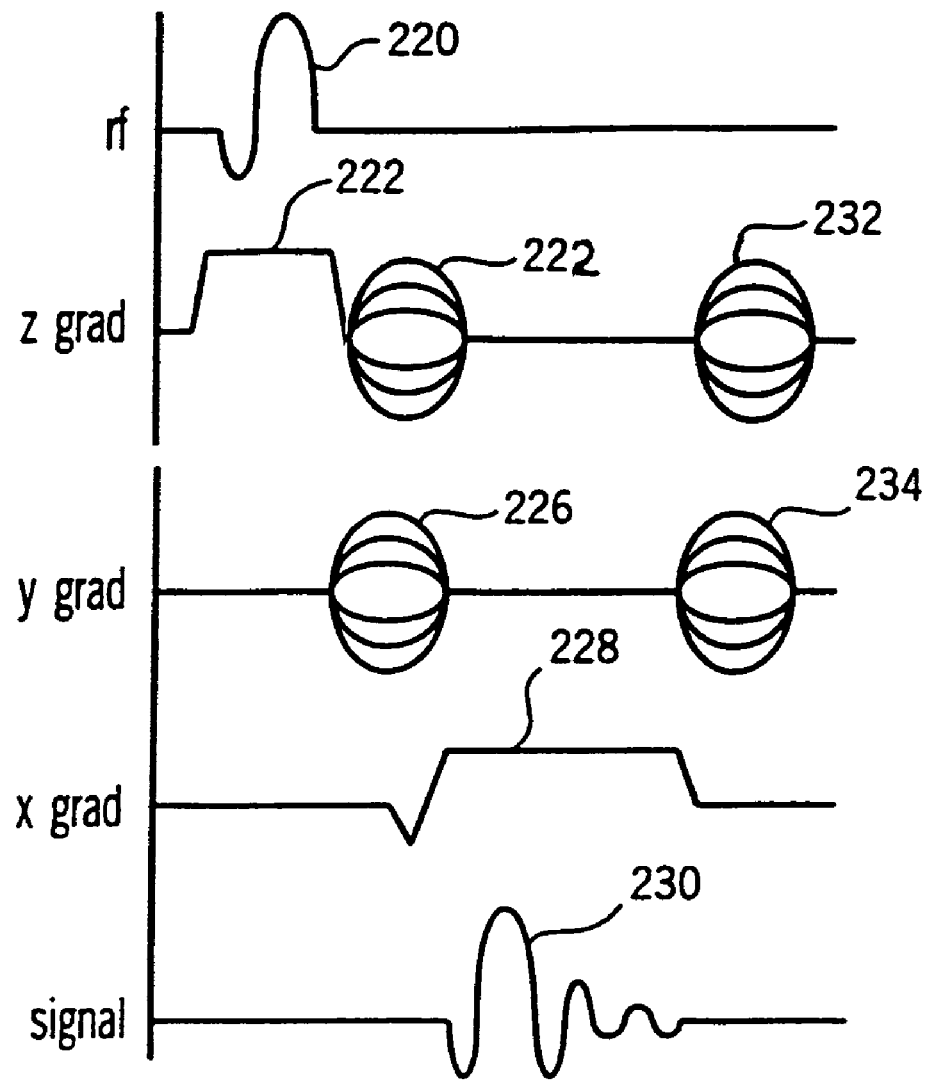
FIG. 2 is a graphic representation of a pulse sequence performed by the MRI system of FIG. 1 to practice a preferred embodiment of the invention.

While many pulse sequences may be used to practice the present invention, in the preferred embodiment a 3D gradient-recalled echo pulse sequence is used to acquire the NMR data. Referring particularly to FIG. 2, an RF excitation pulse 220 having a flip angle of 45 degrees is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 are applied to rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space in the field of view. In the preferred embodiment 32 phase encodings are employed along the z axis and the number of phase encodings employed along the y axis will change during the scan depending on the prescribed lateral $FOV_y$ at each longitudinal location. Sampling along the longitudinal $k_x$ axis is performed by sampling the echo signal 230 in the presence of the readout gradient pulse 228 during each pulse sequence. It will be understood by those skilled in the art that only a partial sampling along the $k_x$ axis may be performed, and if this is done, the missing data is computed using a homodyne reconstruction or by zero filling. This enables the echo time (TE) of the pulse sequence to be shortened to 1.0 ms and the pulse repetition rate (TR) to be shortened to 4.5 ms.

Figure 5:
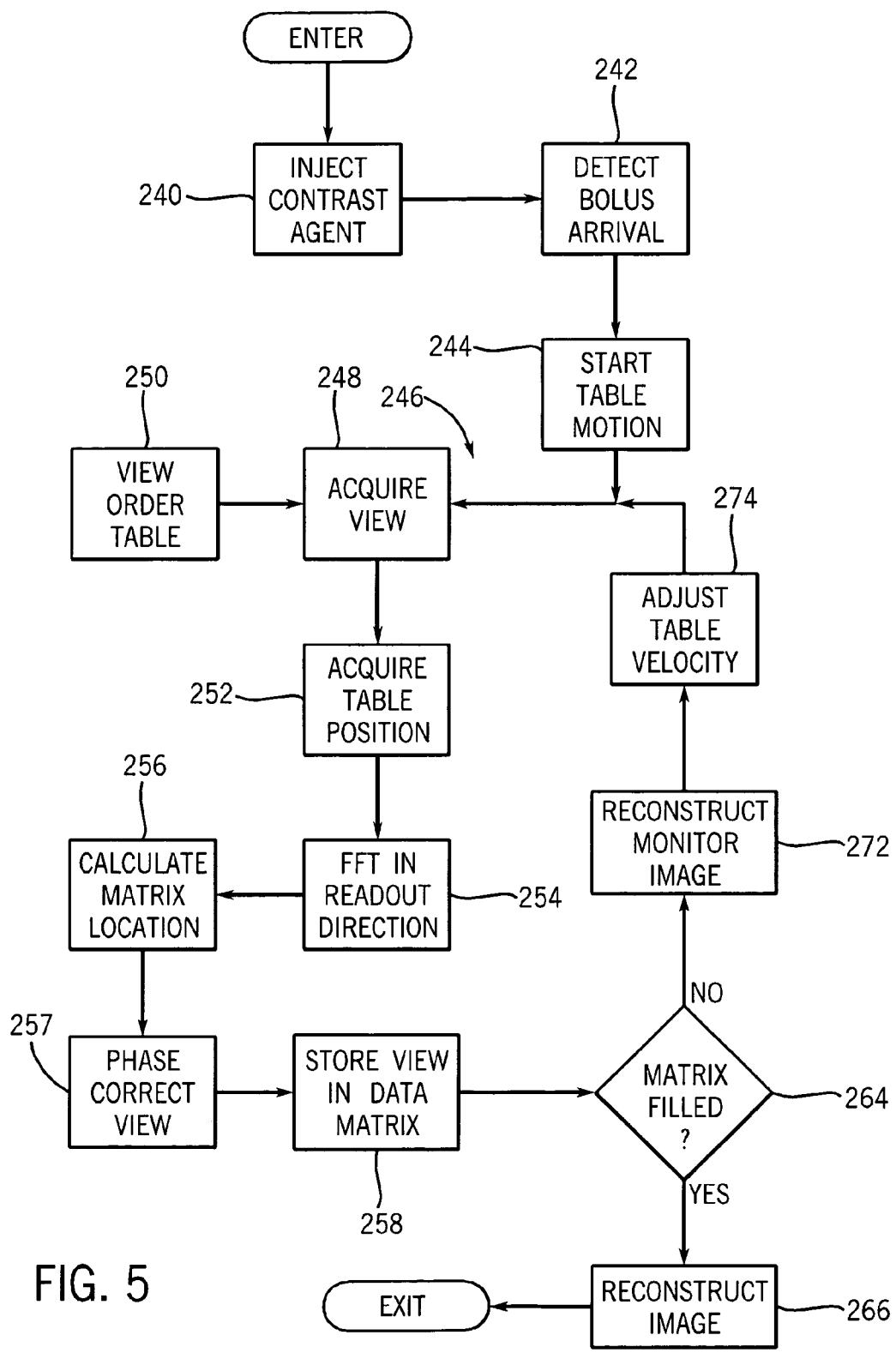
FIG. 5 is a flow chart illustrating the steps employed in practicing the preferred embodiment of the invention.

The preferred embodiment of the invention is a 3D CE-MRA scan of a subject after injection of a contrast agent. When the scan prescription is entered by the operator, scan parameters such as the imaging pulse sequence FOV and resolution are defined along all axes. The $FOV_{tot}$ is also defined and based on this information a data matrix 16 is defined as illustrated in FIG. 4. Referring particularly to FIG. 5, after the injection of the contrast agent at process block 240, 2D images are rapidly acquired and reconstructed to display the vasculature at the starting boundary of the $FOV_{tot}$. Arrival of the contrast bolus is detected at process block 242 by observing when the arteries brighten. At this time table movement is initiated as indicated at process block 244. There are other methods for detecting bolus arrival, including automated methods such as that described in U.S. Pat. No. 6,167,293.

A loop is then entered at 246 in which MRI data is acquired as the table moves the patient through the sweet spot of the scanner. A table reference location is also established at this time. As indicated at process block 248, a view is acquired by performing the above-described pulse sequence. Many different view orders may be employed and the prescribed view order is stored in table 250. In the preferred embodiment described here an elliptical centric view order as described in U.S. Pat. No. 5,912,557 is employed. This view order is characterized by acquiring the central view (i.e., no phase encoding) first and spiraling outward from the center of $k_y$-$k_z$ space. After acquisition of each NMR echo signal, the current table position is also acquired, as indicated at process block 252, and the NMR echo signal is Fourier transformed along the readout direction (x-axis) as indicated at process block 254. As indicated at process block 256, the proper location in the data matrix 16 for the acquired view is then calculated and the view is then phase corrected according to the teachings of the present invention as indicated at process block 257 and as will be described in detail below. The phase corrected view is then stored in the data matrix 16 as indicated at process block 258.

In the preferred embodiment the phase corrections are made in real time during the scan such that phase corrected data is stored in the data matrix 16 and is available for immediate, real time image reconstruction. It is also possible to perform the phase corrections according to the present invention after the acquired image data is stored in the data matrix 16 and after the scan is completed.

Figure 6:
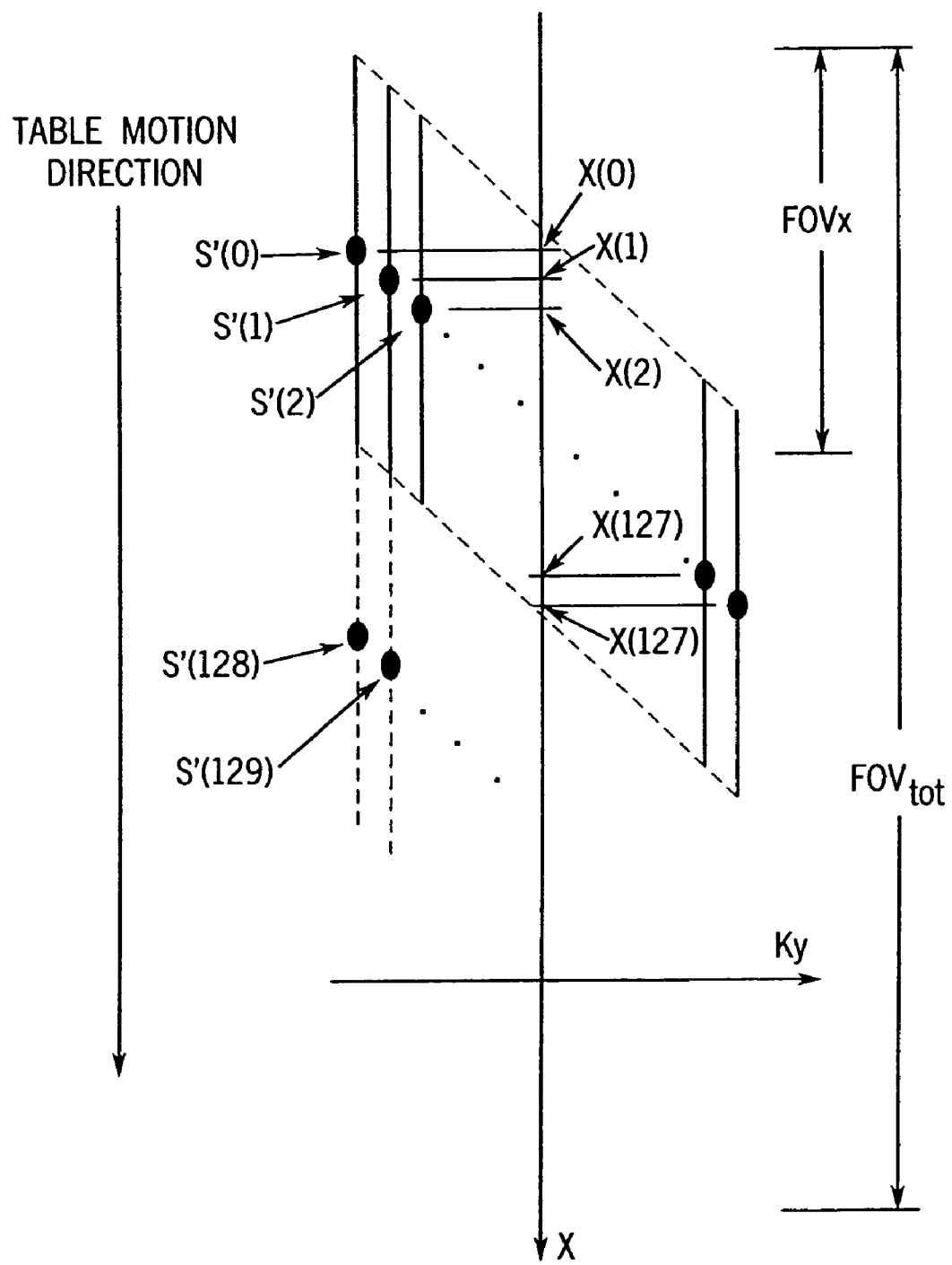
FIG. 6 is a schematic representation showing how acquired data is stored in the data matrix of FIG. 4.
Figure 7:
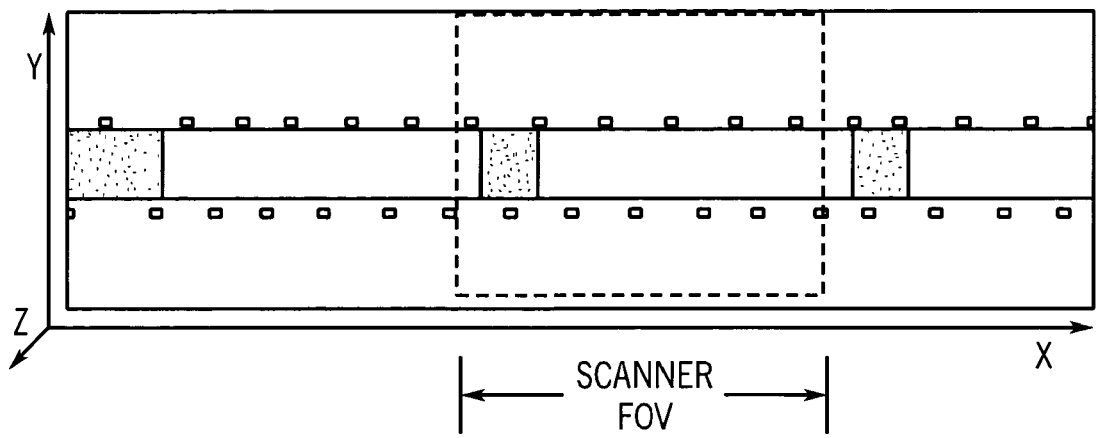
FIG. 7 is an MRA image of a phantom illustrating the image artifact corrected by the present invention.

The location for each acquired view in the data matrix 16 is determined by two factors, the view number and the location of the patient table at the time the view was acquired. This is illustrated in FIGS. 4 and 6 for a two-dimensional acquisition with a monotonic view order. The first view is acquired at echo location x(0) which serves as a reference location. Subsequent views are acquired as the y axis phase encoding is stepped through its values. The location in the data matrix 16 along its lateral $k_y$ axis is determined by the $G_y$ phase encoding for the view. As indicated by arrow 260, the center of each successively acquired NMR echo signal after Fourier transformation along x is also shifted along the x-axis due to table movement. The amount of this shift from the reference position x(0) is measured at the time of view acquisition using an electronic spatial encoder or by using the following equation:

$$x(n)=V_{ref} \cdot t$$

or alternatively $$x(n)=V_{ref} \cdot n \cdot TR$$

where $V_{ref}$ is the table velocity, t is the time past since the beginning of the scan, n is the number of pulse sequence repetitions since the start of the scan and TR is the time required for one pulse sequence repetition. The storage pattern is similar to a usual Cartesian k-space sampling pattern, but it is skewed by the table motion. When all the phase encoding views have been acquired, the process repeats and each new view of once transformed data is concatenated to the previous acquired $k_y$ view. It should be apparent that in a 3D acquisition a series of $k_z$ phase encoded views are also acquired at each $k_y$ phase encoding, and these are shifted and stored in a 3D data matrix 16 in the same manner.

In general, the table motion might be such that the displacement along X from one repetition to the next is not an integral number of X pixels. The data for these repetitions must be shifted with a precision of less than one pixel to maintain consistency. The displacement X(n) is known and can be split into two parts as follows:

$$X(n)=m \cdot \Delta x + \delta(n) \tag{5}$$

where $\Delta x$ is the pixel to pixel spacing along the x-direction:

$$\Delta x = \frac{FOV_x}{N_x} = \frac{FOV_{tot}}{N_{tot}} \tag{6}$$

where $N_x$ and $N_{tot}$ are the number of pixels in the X direction for the echo readout and for the total FOV respectively. Also, m is the largest integer such that $m\Delta x < X(n)$, and $\delta(n)$ is the sub-pixel-sized remainder which forces equation (5) to hold. As before, n is the index on the pulse sequence repetition number. The actual displacement positioning consists of two steps, coarse and fine, presented here in reverse order of application for ease of understanding.

Step 2, coarse positioning: The Fourier transformed signal is shifted by m pixels as given in the first term of equation (5) and directly placed into the hybrid matrix 16 with a positional accuracy of $\Delta x$. The data then requires additional sub-pixel correction by the amount $\delta(n)$ to maintain data consistency. This process is performed in step 1.

Step 1, fine positioning: Prior to Fourier-transformation in X, a phase twist representing the sub-pixel correction $\delta(n)$ is applied along the sampled echo; i.e.

$$\hat{s}_n(k_x, k_y(n)) = e^{i2\pi \frac{k_x}{N_x} \cdot \frac{\delta(n)}{\Delta x}} \cdot s_n(k_x, k_y(n)). \tag{7}$$

Fourier transformation of $\hat{s}_n$ along the x-axis followed by the coarse positioning of Step 2 yields the desired $s'_n(x, k_y(n))$. In principle it would be possible to perform the entire displacement positioning using the phase manipulation approach of equation (7), but because multiple Fourier transformations of length $N_{tot}$ would be required for each $k_y$ value acquired, this "direct method" is not preferred because the two part position shifting and phase shifting has been found to be computationally more efficient.

It can be seen that after one complete cycle of $k_y$ phase encoding values has been completed and stored in the data matrix 16, the process repeats itself and the phase encodings are applied a second time. Each cycle of the phase encoding gradients acquires data for an image volume that extends over the limited FOV of the scanner. Depending upon the number of phase encodings and the patient table velocity, the second time a view is acquired for a specific lateral phase encoding, the placement of the echo signal samples in the data matrix 16 along the x direction may or may not overlap with some of the echo signal samples acquired for the previous measurement at that phase encoding. In the 2D example shown in FIG. 4, such a view is shown at x(n) and the timing is such that there are no overlapping samples with the previously acquired view at x(0). If some overlap occurs then the redundant, overlapping signal samples can be averaged to improve SNR or the most recent sample can be retained. Other options are also possible.

Referring again to FIG. 4, views are acquired and stored in the data matrix 16 until a sufficient number of scanner FOVs have been acquired to cover the entire extended field of view $FOV_{tot}$. The last view is indicated at 262 in FIG. 4, and after it is acquired and stored as determined at decision block 264, the scan is complete and a single image is reconstructed at process block 266 using the samples in data matrix 16. In the 3D acquisition of the preferred embodiment, this reconstruction includes Fourier transformation of the data matrix 16 along the $k_y$ and $k_z$ axes and calculation of pixel intensities from the resulting complex numbers. Typically, a two-dimensional projection image is then produced from the resulting three-dimensional array of image pixel intensities. The well-known maximum intensity pixel ("MIP") technique is preferred for producing the projection image and a pre-contrast mask image may also be subtracted to suppress signals from non-vascular tissues.

As shown in FIG. 4, the extended field of view $FOV_{tot}$ over which complete k-space sampling is acquired is smaller than the x axis extent over which samples are acquired. The regions 268 and 270 of partial sampling at the beginning and end of the scan can also be reconstructed to extend the total field of view, but it can be appreciated that image quality will decline as fewer samples are used in the reconstruction.

Referring again to FIG. 5, after each view is acquired and stored during the scan, data in the data matrix 16 may be employed to reconstruct a two-dimensional monitor image as indicated at process block 272. Real-time images are thus produced for the operator who can use the information therein to control the scanning process. In addition to changing the usual scan parameters, the operator can adjust the table velocity as indicated at process block 274. This might be done, for example, to better match table speed to the speed at which the contrast bolus is moving through the extended field of view $FOV_{tot}$.

The real-time 2D monitor image may be produced in a number of ways. The preferred method is to reconstruct a full maximum intensity pixel (MIP) projection through the image stack as the data is being acquired. Unlike typical static 3D image acquisitions, a partial 3D data set can be reconstructed as the hybrid matrix fills. For Nz slices and Ny phase encodes in Y, Ny Fourier transforms in the Z direction and Nz Fourier transforms in the Y direction can be performed with each TR. Each set of these described Fourier transform sets in Z and Y (including the previous transform in X) provide a partial 3D image set that is of one pixel length in the X direction. Ny pixels in the Y direction and Nz pixels in the Z direction. The maximum pixel value of a projection through this partial image set as well as earlier partial data sets can be found at the same time. The projection may be in the Z direction directly or in oblique angles through previously reconstructed partial image sets. The 2D MIP images can be displayed on the real-time monitor as each portion of the 3D data set is filled. Also, specific individual slices from the 3D data set can be viewed in real time rather than the MIP projection.

The longitudinal $FOV_x$ can be varied during the scan. An acquisition can be performed with higher table velocity and thus greater temporal efficiency if a portion, or all of the hybrid space is acquired with a larger $FOV_x$. $FOV_x$ can also be reduced if a higher spatial resolution is desired for a limited region within the $FOV_{tot}$. Regardless of changes in table speed or readout $FOV_x$, a single, data matrix 16 is formed from which a seamless image of the extended field of view $FOV_{tot}$ can be reconstructed.

Figure 8:
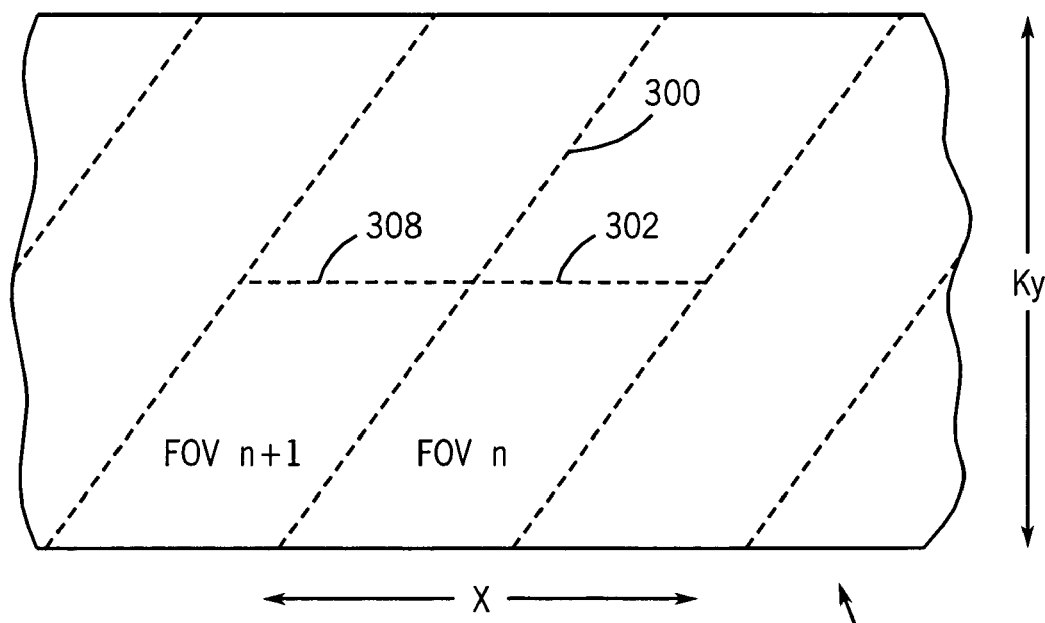
FIG. 8 is a pictorial representation of a portion of the data matrix of FIG. 4.
Figure 9:
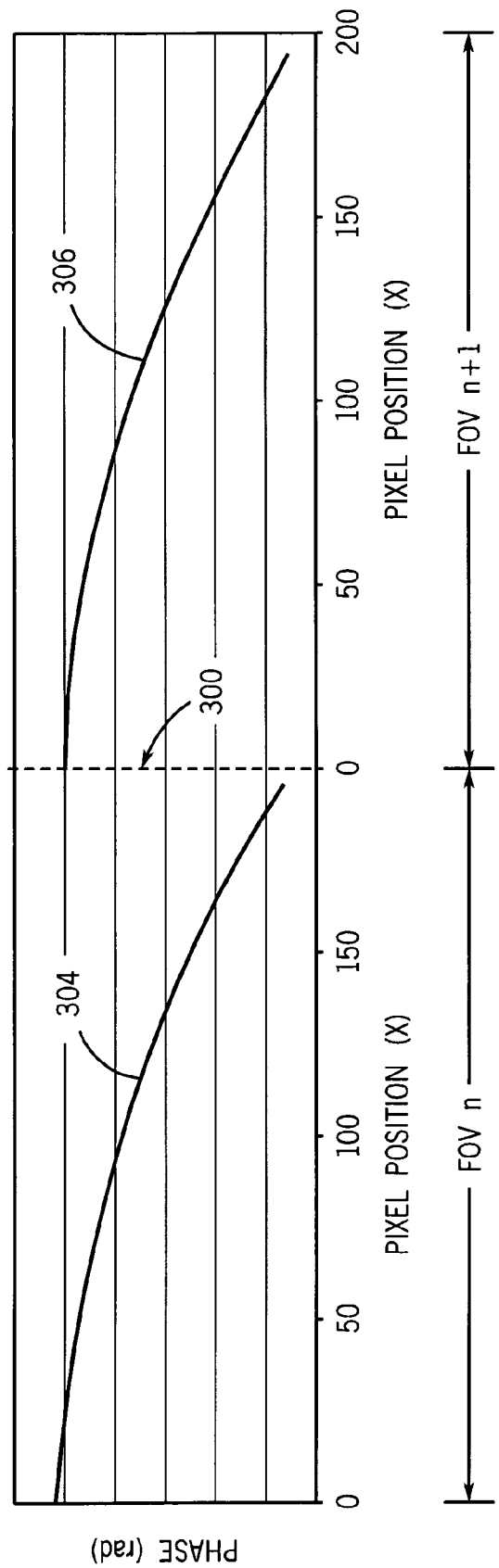
FIG. 9 is a graphic representation of the phase shift that occurs across the boundary between two successive fields of view (FOV)

One aspect of the present invention is the discovery of the source of the fallout image artifacts. More specifically, it was discovered that the fallout is due to a discontinuity in the phase of image data that occurs at the boundary between each acquired FOV of data in the data matrix 16. Referring to FIG. 8, this discontinuity occurs at a boundary 300 where views acquired in one $FOV_n$ are concatenated to views acquired in the subsequent $FOV_{n+1}$. If one plots the phase of the central DC view 302 in the $FOV_n$ as a function of x, a curve 304 is produced as shown in FIG. 9. As used herein, the term "central DC view" is the view acquired at or near the center of k-space in which the phase encoding is substantially zero. A similar plot 306 of the phase of the central DC view 308 in the next $FOV_{n+1}$ reveals a large discontinuity, or change, in the phase at the boundary 300.

While the phase differences occur along the readout direction (x), the artifact is primarily caused during the Fourier transforms along $k_y$ and $k_z$. It is the Fourier transform operations in these directions that require phase consistency. The solution to the problem, therefore, requires correction of the phase of the acquired data along the readout direction (x) such that the discontinuity in signal phase at FOV boundaries is substantially eliminated.

For any 3DFT pulse sequence such as that shown in FIG. 2, the acquired NMR signal is completely defined in k-space. In a continuous table motion scan the phase encodes are typically played out in cycles. For example, in a straightforward 3DFT acquisition, one set of $N_y \times N_z$ encodes is played out as the table moves a distance FOV, and then the cycle is repeated until the entire extended $FOV_{tot}$ is sampled. Let $S_n$ be the NMR signal Fourier transformed along the readout axis x from the n-th repetition:

$$S_n = M(x_n, x, k_y, k_z) e^{-i\phi(x_n, x, k_y, k_z)}$$  Eq. (8)

where $x_n$ represents the table position for that repetition. As is typical in all MR imaging, each FOV has at least one central DC view acquired at or near the center of $k_Y$ and $k_z$ space. The phase of this view after Fourier transformation in the readout direction (x) constitutes a phase measurement for the entire FOV volume.

$$S_{DC} = M_{DC}(x_{DC}, x, 0, 0) e^{+i\phi(xDC, x, 0, 0)}.$$  Eq. (9)

We can apply that phase measurement to correct the phase of all the other views acquired in that phase encoding cycle. For example, with an elliptical centric view order the central view is acquired at the start of each phase encoding cycle while for a sequential y or sequential z phase encoding order it occurs at the middle of the cycle. The basis of the correction is to apply the inverse phase of the central DC view to all measurements within that phase encoding cycle. Thus, the corrected hybrid space signal $S'_n$ is given by:

$$S'_n = S_n \cdot e^{-i\phi(xDC, x, 0, 0)}.$$  Eq. (10)

$$S'_n = [M_n(x_n, x, k_y, k_z) e^{-i\phi(x_n, x, k_y, k_z)}] \cdot e^{+i\phi(xDC, x, 0, 0)}$$  Eq. (11)

This phase correction results in the central k-space view(s) in hybrid space having exactly zero phase along the entire readout extent. Each view from the same FOV as the central DC view is also given that phase correction. The phase correction removes the problematic phase but retains the necessary structural phase information of the object produced by the phase-encoding gradients. Each FOV requires its own correction. Thus, for a five FOV scan for an extended $FOV_{tot}$ image there would be five different central DC views and five measurements of phase error (Eq. 9).

Figure 10:
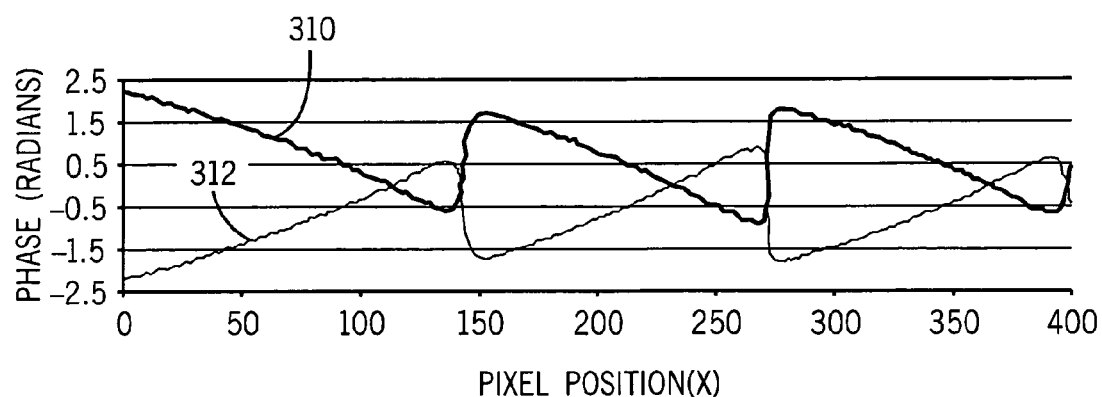
FIG. 10 is a graphic representation of the phase shift in a central DC view across three FOVs and the corresponding phase corrections.
Figure 11:
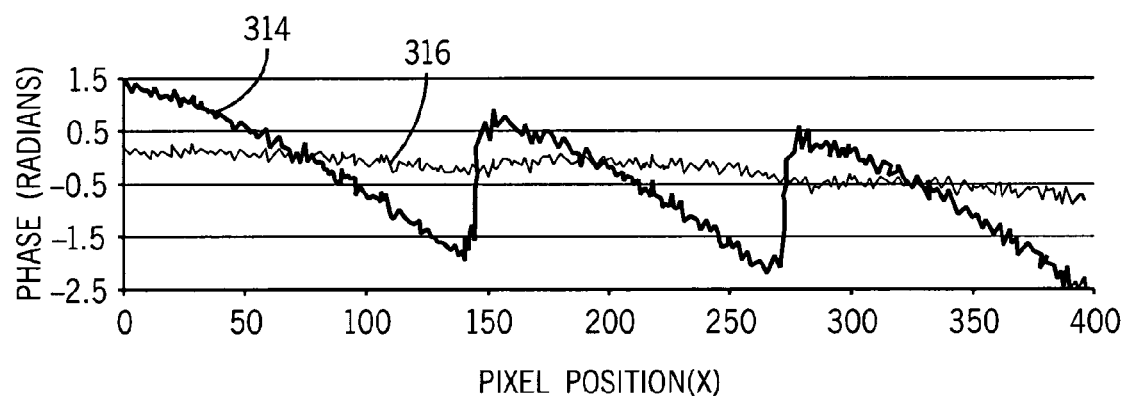
FIG. 11 is a graphic representation of the phase of a view across three FOVs before and after phase correction.

Referring particularly to FIG. 10, the phase of three concatenated central DC views is depicted by plot 310. This corresponds to the phase measurement $S_{DC}$ of Equation (9). The corresponding phase corrections are depicted by the plot 312. As indicated above, when this phase correction 312 is applied to central DC views 310, the phase is nulled. Referring to FIG. 11, when this same phase correction is made to the other views in the FOV, the phase shift which causes the fallout artifact is removed. The phase of three such concatenated views is shown by plot 314 and the resulting phase of these same three views after phase correction with values indicated by plot 312 in FIG. 10 is shown by plot 316. Note that the phase discontinuities are removed in this hybrid-space data.

Figure 12:
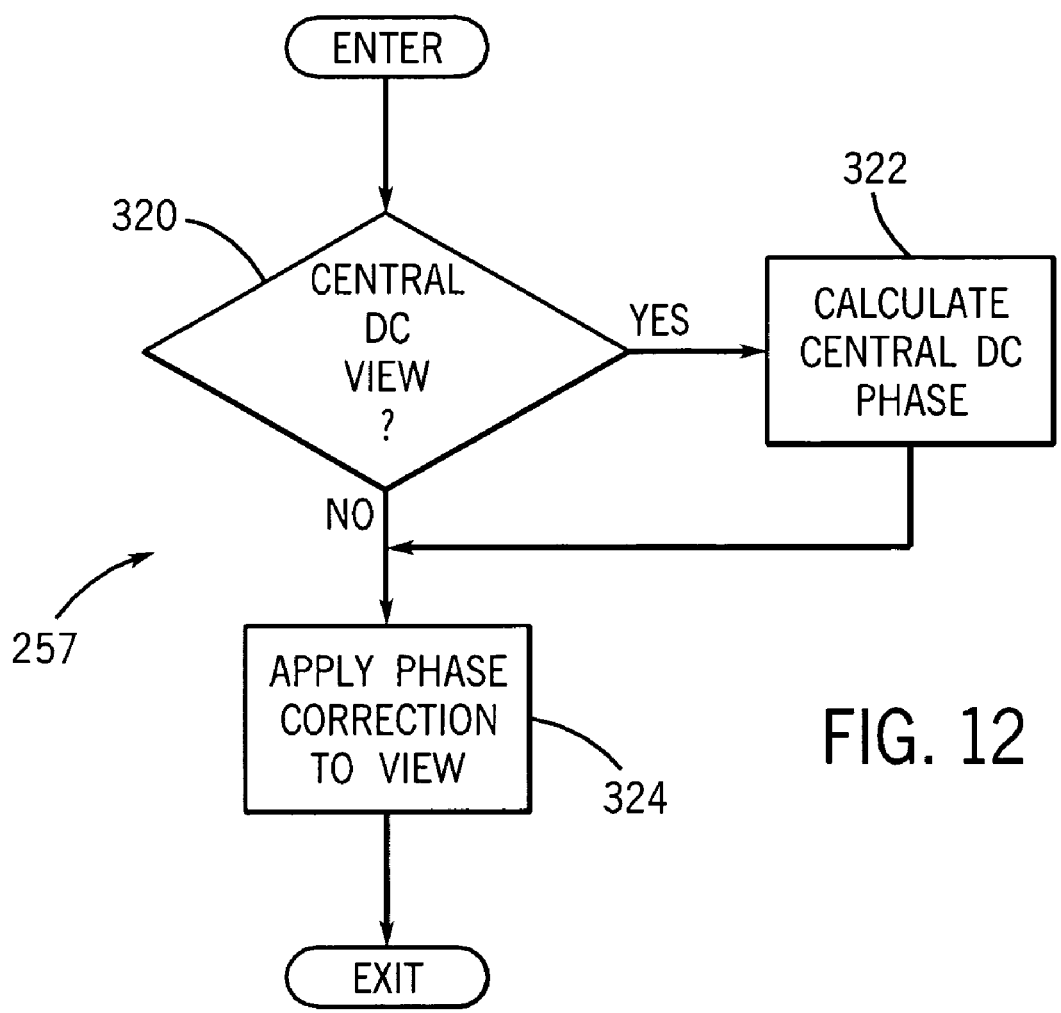
FIG. 12 is a flow chart of the view phase correction process that forms part of the method of FIG. 5.

Referring particularly to FIGS. 5 and 12, as each view is acquired during a scan it is phase corrected at process 257 according to the present invention. A check is made at decision block 320 to determine if the acquired view is the central DC view. If it is, the phase of each k-space sample in the central DC view is calculated at process block 322 using the quadrature values:

$$\phi = \tan^{-1} I/Q.$$

These phase values $\phi$ are used to correct the phase of the central DC view and any subsequently acquired views as indicated at process block 324. More specifically, each calculated phase value $\phi$ is subtracted from the phase of the corresponding k-space sample in the view to be corrected as indicated above in Equation (11).

In the preferred embodiment an elliptical centric view order is employed so that the central DC view is acquired first for each FOV. The phase corrections calculated at process block 322 are thus applied to each of the subsequent views acquired as the elliptical centric acquisition cycle plays out. The receipt of the next central DC view signals the start of the next FOV acquisition and a new set of phase corrections are calculated at process block 322 and applied to subsequent views.

We have identified and described data phase dispersion as the cause of a troublesome artifact in continuously moving table extended-FOV MRI imaging. The non-uniform phase along the readout direction of the acquisition inherent in all MRI systems can cause intensity falloff as well as reduction of image resolution when the data is shifted to reflect the moving table position. Correction is accomplished by adjusting the phase of all views within a view cycle by a phase factor that is measured from the central DC view for that view cycle. The correction has been demonstrated in phantom and in vivo studies.

Although the phase discontinuity can be partially corrected with careful magnetic field shimming along the readout direction, this in general does not provide a flat phase profile along the readout and has typically provided unsatisfactory results. Also, the application of an apodizing window to the leading and trailing edges of the hybrid space data smoothes the phase transitions but does not eliminate them.

The phase correction according to the present invention can be implemented easily during image reconstruction with a relatively simple function. After sampling the phase of the central DC view for each view cycle, each data point in each phase encoding view requires only one complex multiplication to rotate the phase and effectively subtract the phase error. The operation requires little computation and thus adds insignificant time to the reconstruction process.

In conclusion, correction of the phase of data acquired using continuously-moving-table acquisition provides improved phase alignment at the boundary region between FOVs in hybrid space. The correction eliminates the intensity losses at the FOV boundaries and restores spatial resolution in the reconstructed image.

The invention claimed is:

1. A method for producing an image of a subject over an extended longitudinal field of view ($FOV_{tot}$) which is larger than a longitudinal field of view (FOV) of a magnetic resonance imaging (MRI) system having a defined longitudinal field of view (FOV), the steps comprising:
   a) moving the subject through the MRI system such that the extended longitudinal field of view ($FOV_{tot}$) passes through the defined longitudinal field of view (FOV);
   b) continuously acquiring NMR data from the subject as the subject is moved through the longitudinal FOV during a scan by repeatedly performing an imaging pulse sequence which acquires NMR data comprising a view of the subject;
   c) Fourier transforming each acquired view;
   d) storing each transformed view in a data matrix;
   e) calculating phase correction values from central DC views acquired during the scan that have no phase encoding applied;
   f) phase correcting transformed views using the calculated phase correction values; and
   g) reconstructing an image from phase corrected and transformed views stored in the data matrix.

2. The method as recited in claim 1 in which the MRI system has a table, and step a) is performed by:
   i) placing the subject on the table; and
   ii) moving the table.

3. The method as recited in claim 2 in which the table is moved continuously while performing step a).

4. The method as recited in claim 2 in which the table is moved at different velocities while performing step a).

5. The method as recited in claim 2 which includes:
   injecting the subject with a contrast agent; and
   in which the table is moved at a velocity which tracks the contrast agent as it moves through the extended longitudinal field of view ($FOV_{tot}$).

6. The method as recited in claim 2 in which step d) includes adjusting the location in the data matrix in which the view is stored as a function of the table location at the time the view is acquired in step b).

7. The method as recited in claim 1 in which step b) is performed by repeating a view order in which one of said central DC views is acquired at the beginning of the view order and step f) is performed by correcting subsequent views acquired during the view order with phase correction values calculated in step e) using the one central view acquired at the beginning of the view order.

8. The method as recited in claim 7 in which the view order is elliptical centric.

9. The method as recited in claim 1 in which step f) is performed before performing step d).

10. The method as recited in claim 1 in which the imaging pulse sequence employed in step b) acquires the NMR data while producing a readout gradient directed along the direction of subject movement.

11. The method as recited in claim 1 in which step e) is performed by calculating the phase of the central DC view.

12. The method as recited in claim 11 in which step f) is performed by subtracting the phase of the central DC view from the corresponding phase of the transformed view.

13. A magnetic resonance imaging (MRI) system comprising:
   a table for supporting a subject and for moving the subject through a defined longitudinal field of view (FOV) of the MRI system;
   a pulse generator for operating the MRI system under the direction of a pulse sequence to continuously acquire a series of NMR data views during a scan of the subject as the subject is moved through the longitudinal FOV; and
   a processing system configured to:
   Fourier transform each acquired view;
   store the transformed views as a data matrix;
   calculate phase corrections from transformed central DC views acquired during the scan that have no phase encoding applied;
   phase correct the transformed views using the calculated phase corrections; and
   reconstruct an image from the phase corrected and transformed views.

14. The system as recited in claim 13 wherein the processing system is further configured to:
   determine table location as each view is acquired; and
   store the Fourier transformed view in the data matrix at a location determined by the table location at the time the view was acquired.

15. The system as recited in claim 14 wherein the processing system is further configured to:
   control the velocity of table motion as views are being acquired.

16. A method for producing an image of a subject over an extended longitudinal field of view ($FOV_{tot}$) which is larger than a longitudinal field of view (FOV) of a magnetic resonance imaging (MRI) system having a defined longitudinal field of view (FOV), the steps comprising:
   a) moving the subject through the MRI system such that the extended longitudinal field of view ($FOV_{tot}$) passes through the defined longitudinal field of view (FOV);
   b) continuously acquiring NMR data from the subject as the subject is moved through the longitudinal FOV during a scan by repeatedly performing an imaging pulse sequence which acquires NMR data comprising a view of the subject;
   c) Fourier transforming each acquired view;
   d) storing each transformed view in a data matrix;
   e) calculating phase correction values from central DC views acquired during the scan;
   f) phase correcting transformed views using the calculated phase correction values to correct for phase shifts along a readout direction to reduce discontinuity in signal phase at FOV boundaries; and g) reconstructing an image from phase corrected and transformed views stored in the data matrix.

17. The method as recited in claim 16 in which the table is moved continuously while performing step a).

18. The method as recited in claim 16 in which step d) includes adjusting the location in the data matrix in which the view is stored as a function of the subject location at the time the view is acquired in step b).

19. The method as recited in claim 16 in which step b) is performed by repeating a view order in which one of said central DC views is acquired at the beginning of the view order and step f) is performed by correcting subsequent views acquired during the view order with phase correction values calculated in step e) using the one central view acquired at the beginning of the view order.

* * * * *

UNITED STATES PATENT AND TRADEMARK OFFICE
CERTIFICATE OF CORRECTION

| | | |
|---|---|---|
| PATENT NO. | : 7,437,188 B2 | Page 1 of 1 |
| APPLICATION NO. | : 11/060934 | |
| DATED | : October 14, 2008 | |
| INVENTOR(S) | : Kruger et al. | |

It is certified that error appears in the above-identified patent and that said Letters Patent is hereby corrected as shown below:

On the Title Page Item (75), "Daivd" should be --David--.

Signed and Sealed this

Thirtieth Day of March, 2010

David J. Kappos
*Director of the United States Patent and Trademark Office*